United States Patent
Suko et al.

(10) Patent No.: US 7,863,964 B2
(45) Date of Patent: Jan. 4, 2011

(54) LEVEL SHIFTING SWITCH DRIVER ON GAAS PHEMT

(75) Inventors: Scott K. Suko, Dayton, MD (US);
Andrew R. Passerelli, Ellicott City, MD (US); Gregory D. Nachtreib, Elkridge, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 523 days.

(21) Appl. No.: 11/964,886

(22) Filed: Dec. 27, 2007

(65) Prior Publication Data

US 2009/0167409 A1 Jul. 2, 2009

(51) Int. Cl.
*H03K 17/00* (2006.01)
(52) U.S. Cl. .................. 327/416; 327/427; 327/436; 327/437
(58) Field of Classification Search .................. 327/416, 327/427, 436–437
See application file for complete search history.

(56) References Cited

U.S. PATENT DOCUMENTS

| | | | |
|---|---|---|---|
| 4,626,806 A | 12/1986 | Rosar et al. | |
| 5,834,975 A | 11/1998 | Bartlett et al. | |
| 6,440,767 B1 | 8/2002 | Loo et al. | |
| 6,486,511 B1 | 11/2002 | Nathanson et al. | |
| 6,804,502 B2* | 10/2004 | Burgener et al. | 455/333 |
| 6,819,201 B2* | 11/2004 | Jain | 333/104 |
| 6,876,056 B2 | 4/2005 | Tilmans et al. | |
| 6,937,111 B2* | 8/2005 | Kwon | 333/100 |
| 7,098,755 B2 | 8/2006 | Zhao et al. | |
| 7,206,552 B2 | 4/2007 | Asano et al. | |
| 7,221,207 B2 | 5/2007 | Fukumoto et al. | |
| 2002/0158710 A1 | 10/2002 | Penn | |
| 2004/0164787 A1 | 8/2004 | Panhofer | |
| 2007/0146020 A1 | 6/2007 | Williams | |
| 2007/0182616 A1 | 8/2007 | Quinn et al. | |

OTHER PUBLICATIONS

GaAs FET Switches, Anand Gopinath and J. Bruce Rankin, IEEE Transactions on Electron Devices, vol ED-32, No. 7, Jul. 1985.
Low Insertion Loss and High Linearity PHEMT SPDT and SP3T Switch ICs for WLAN 802.11a/b/g Applications, Zeji Gu, Dave Johnson, Steven Belletete, Dave Fryklund, 2004 IEE Radio Frequency Integrated Circuits Symposium, pp. 505-508.

* cited by examiner

*Primary Examiner*—Kenneth B. Wells
(74) *Attorney, Agent, or Firm*—Marsteller & Associates, P.C.

(57) ABSTRACT

A radio frequency semiconductor switching device (S) is formed on an MMIC structure (C) including a switching circuit element (12) having four semiconductor switching units (68, 70) with each adapted for receiving a gate control signal. A level shift circuit (10) generates a biasing voltage signal communicated of the switching units (68, 70) for biasing the switching units (68), and provides an output that swings between approximately one diode drop above ground and a negative voltage to bias the switching circuit elements (68 and 70) for reduced loss. The level shift circuit (10) is responsive to an externally provided control signal (58). The switching units (68, 70) are formed into a grouping of at least, a first and a second set (76, 78) of interconnected semiconductor switching units (68, 70) with each set (76, 78) having gates of at least two of the interconnected switching units (68, 70) connected with the level shift circuit output (60, 62). Both the switching units (68, 70) and the level shift circuit (10) are formed on the MMIC structure (C).

9 Claims, 6 Drawing Sheets

US 7,863,964 B2

LEVEL SHIFTING SWITCH DRIVER ON GAAS PHEMT

BACKGROUND OF THE INVENTION

1. Technical Field

The invention relates to the field of semiconductor switching devices for switching at high frequencies, and more particularly to a semiconductor single pole, double throw (SPDT) switching device or multi-throw (multi-output) switches operating in the radio frequency ranges.

2. Background Art

Many radio frequency (RF) switches are used in transit and receive (T/R) modules for active array radars. Integrated into Gallium Arsenide (GaAs) monolithic microwave integrated circuits (MMICs), these switches control the flow of RF to and from an antenna to various active circuits such as sections of the attenuator, phase shifter, and select the Transmit or Receive path (T/R switch). The insertion loss of such switches is a critical parameter which affects module noise figure and efficiency. The achievable insertion loss of such an RF switch is driven by the product of the switch's on state resistance and off state capacitance. A lower on resistance reduces insertion loss, but scaling up device width in order to achieve lower on state resistance increases the switch's capacitance, which has an adverse effect on a switch's off state isolation, so this method of scaling down insertion loss involves an undesirable tradeoff.

A typical Single Pole Double Throw (SPDT) switch integrated into a pHEMT (pseudomorphic high electron mobility transistor) MMIC consists of four switches which join three RF ports and ground. The "series" switch between two of the RF ports is enabled to allow RF to flow through that path. The "shunt" RF switch on the remaining port is enabled to short it to ground.

The control levels for these switches have traditionally been either 0 V/−5 V or 0 V/−3.3 V derived from a silicon control application-specific integrated circuit (ASIC). In the depletion mode pHEMT technology used in most MMIC designs, with zero volts gate to source, a switch device is ON, and with −5 V on the gate electrode the device is OFF.

Even though with zero volts on the gate a pHEMT switch is ON, it is well known that the resistance of a pHEMT device decreases further as the gate source voltage is increased above zero volts. The voltage that can be applied is limited by the pHEMT devices Schottky Diode gate forward biasing. While it is possible to use dual supply voltages on an external control ASIC to take advantage of this effect, it is inconvenient to do so, and it is difficult to maximize the advantage of doing so by matching the positive swing to the pHEMT process diode drop since this changes with temperature.

U.S. Pat. No. 7,206,552 teaches a switch that differs from the present invention in that it does not include a shunt element. It is believed that no explicit teaching of the biasing method of the gate electrodes of the FET switches is given. It is also believed that a pair of transistors with differing pinch off thresholds is used thereby likely requiring a customized GaAs process.

U.S. Pat. No. 5,834,975 teaches the use of RF switches as a controllable power combiner. The switches disclosed are micro-electromechanical (MEMS), which may be the lowest loss switch technology available. The present invention involves integrated biasing with a GaAs switch.

U.S. Pat. No. 6,440,767 discloses an RF SPDT switch; however, it is mechanical in nature (MEMS technology), rather than solid state as is the present invention (GaAs technology).

U.S. Pat. No. 6,876,056 also teaches a MEMS switch with a moveable element, rather than solid state (GaAs technology).

U.S. Pat. No. 4,626,806 shows a SPDT RF switch, but it is implemented as with PIN diodes rather than field effect transistor (FET) or pHEMT switches.

U.S. Pat. No. 6,486,511 teaches a SPDT RF switch, but it relies upon a custom very high resistance gate material. Such switch is shown as silicon (Si) technology, rather than GaAs. The biasing of the present invention is not applicable to such a type of switch since it does not have a diode type gate terminal (like pHEMT and JFETs do).

While the above cited references introduce and disclose a number of noteworthy advances and technological improvements within the art, none completely fulfills the specific objectives achieved by this invention.

DISCLOSURE OF INVENTION

In accordance with the present invention, a radio frequency semiconductor switching device is formed on a monolithic microwave integrated circuit (MMIC) structure and includes a switching circuit element with at least four electronic semiconductor component switching units with each switching unit adapted for receiving a gate input signal at a gate electrode of the semiconductor switching units. A level shift circuit included in the same MMIC generates a biasing voltage signal at an output source and electrically communicates with the gate electrodes of the switching units for biasing the gate electrodes of the switching units. The level shift circuit is responsive to an externally provided control signal, and provides an output that swings between approximately one diode drop above ground and a negative voltage to bias the switching circuit elements for reduced loss. The semiconductor switching units are formed into a grouping of at least a first and a second set of interconnected semiconductor switching units with each set of interconnected semiconductor switching units having respective gate electrodes of at least two of the interconnected switching units in the set of interconnected switching units being electrically connected with an output source of the level shift circuit. Both the switching units and the level shift circuit are formed on the MMIC structure.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

MODE(S) FOR CARRYING OUT THE INVENTION

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

Figure 1:
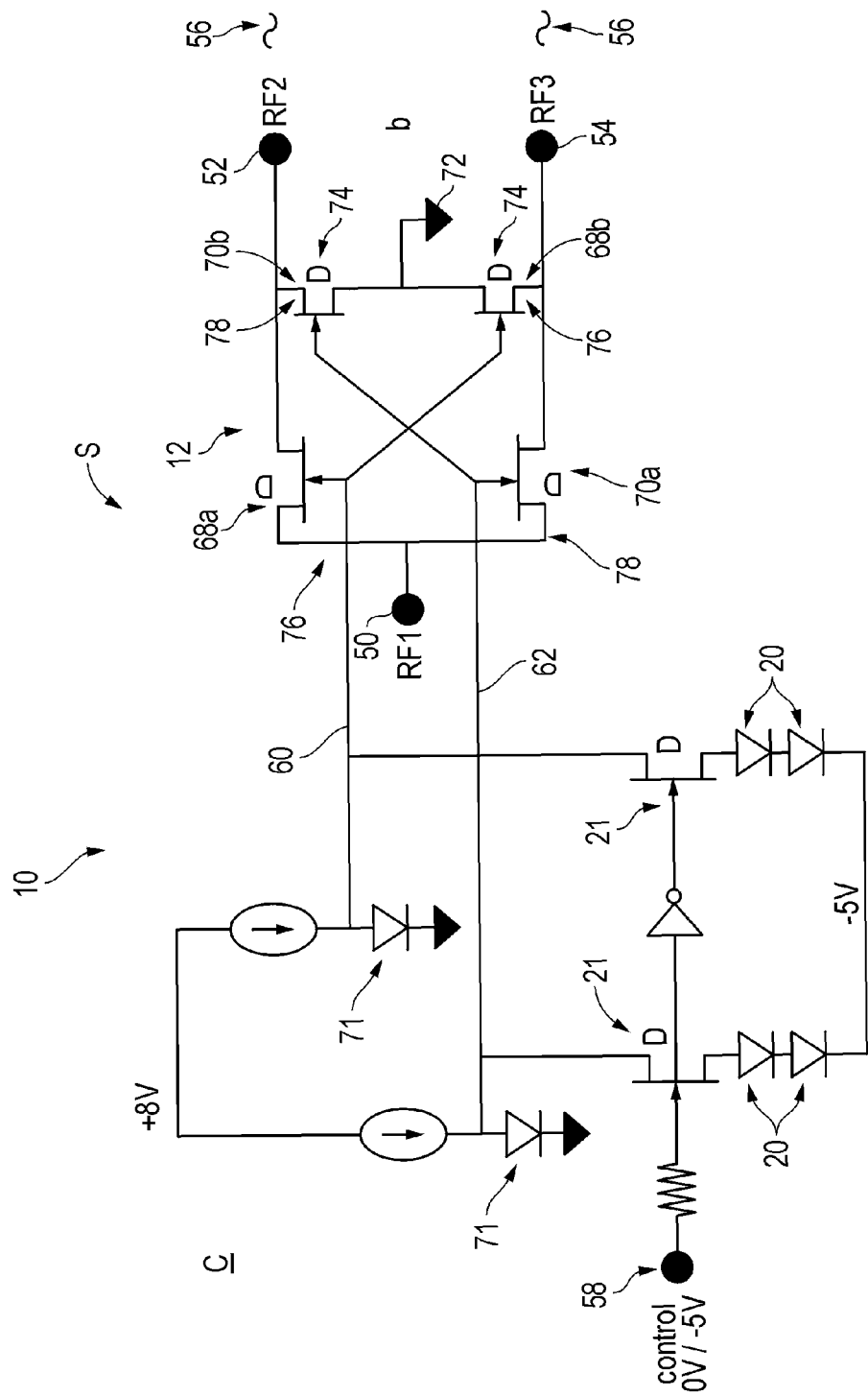
FIG. 1 is a block diagram of a RF switch and driver of the present invention.
Figure 2:
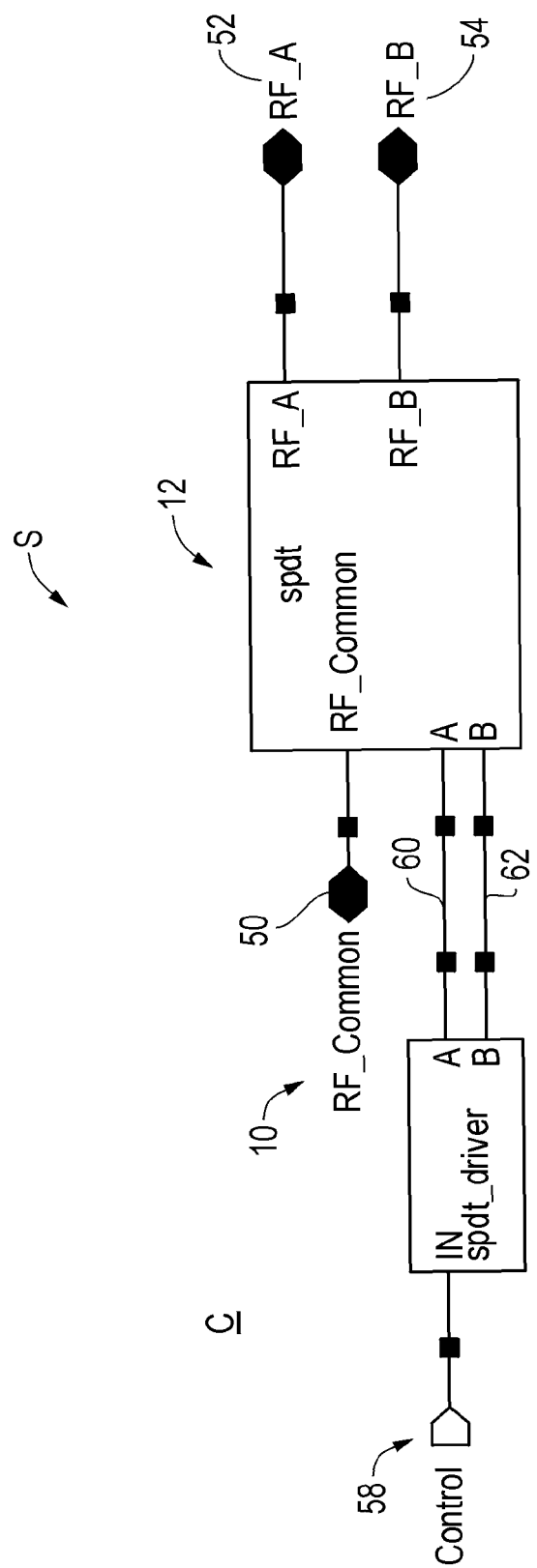
FIG. 2 is the top level of a hierarchical schematic diagram of a switch and driver, with FIGS. 3 and 4 being portions of this hierarchal schematic as well.
Figure 3:
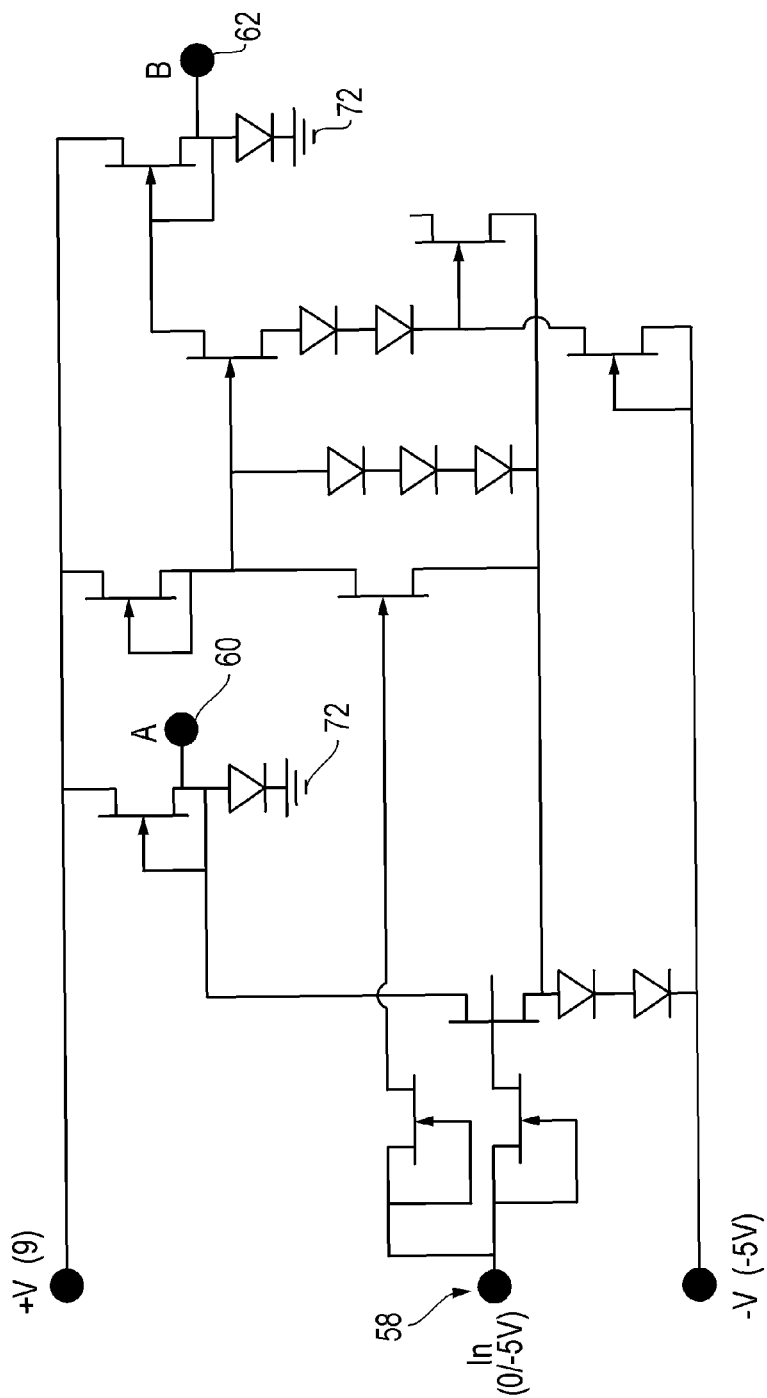
FIG. 3 is a schematic diagram of the driver unit of FIG. 2.
Figure 4:
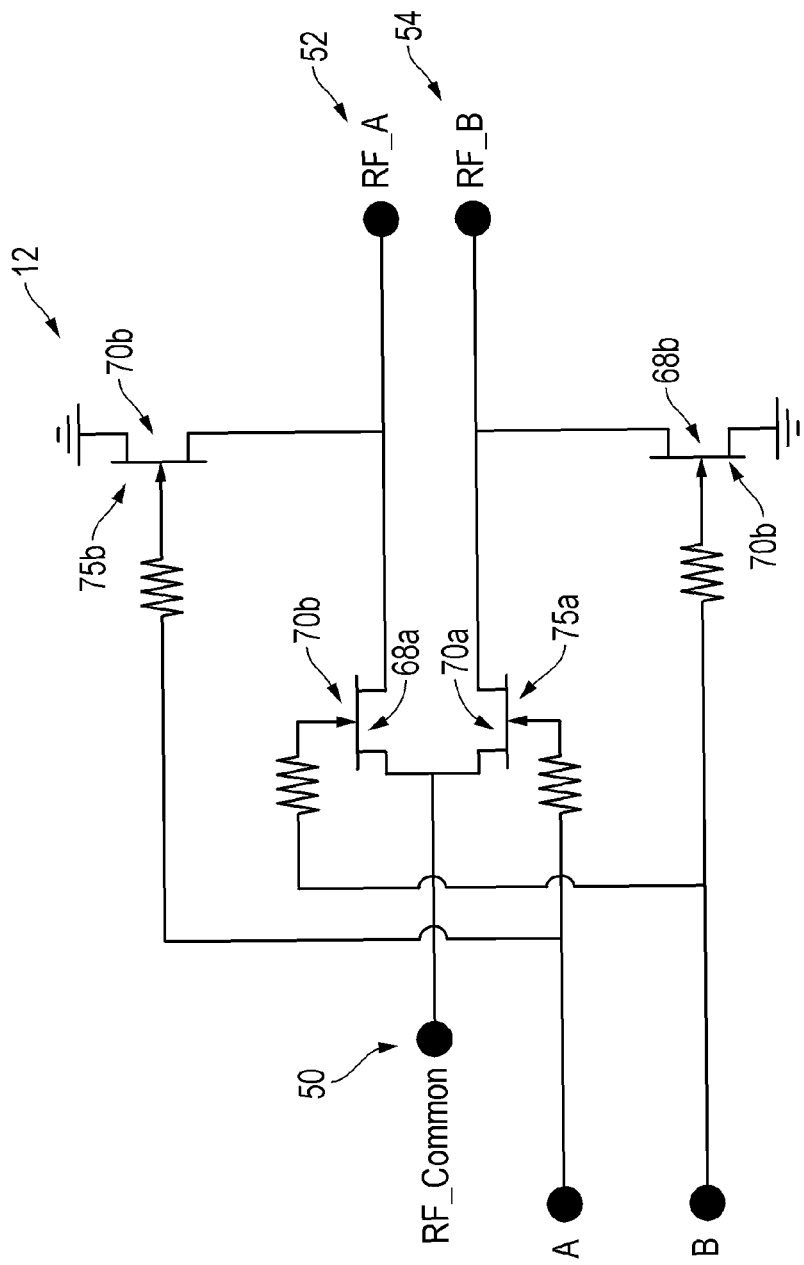
FIG. 4 is a schematic diagram of the switch unit of FIG. 2.

A simplified block diagram is shown in FIG. 1, and a hierarchical schematic of the novel circuit is shown in FIGS. 2-4.

A SPDT (Single Pole Double Throw) RF switching device S is implemented in a semiconductor chip C formed as or through a GaAs pHEMT, or other depletion mode diode gate III-V semiconductor process, with both series and shunt RF switch devices. The present switching device S includes a level shift circuit 10 that is integrated into die same GaAs chip as the switching circuit 12 where the level shift circuit 10 accepts logic voltage levels and delivers both positive and negative biasing voltages for biasing the RF switch devices 68 and 70, generally (68a-68b and 70a-70b), into a low loss state. A positive voltage state is determined by another on chip diode(s) 71 in order to bias the gate electrode(s) 73 and 75, generally (73a-73b and 75a-75b), of the RF switch devices just to the edge of conduction; thereby, minimizing on resistance and insertion loss without conducting substantial DC current onto the gate terminal of semiconductor component switching devices 68 or 70 of the RF switch device S.

An RF input signal may be introduced at a first connection or port 50, and the multiple output or second connections or ports 52 and 54 provide the switched output signal 56.

A control signal or voltage is introduced at connection or port 58 of the driver circuit 10 that is generally from a known external controller device, not shown, as desired. The level shift or driver circuit 10 functions to translate the voltage to a change in DC levels that is then passed to the gate electrodes 73 or 75 of the switching components 68 or 70.

With reference to FIG. 1, a grouping of on MMIC diodes 20 are used in the driver circuit segment 10 to offset a source voltage of the control devices 21 so they can fully switch OFF in response to an input control signal 58 that swings between ground and the negative supply rail (−5 V). The control devices 21, in response, provide drain currents which pull down the gate terminal of the RF switching components 68 or 70. In the opposite state when a particular control device 21 is off the gate terminal 73 or 75 of the respective switching devices 68 or 70 is pulled up by an on chip current source. Typical DC blocking capacitors and other associated electronic components that may be used by design are not shown in FIG. 1 for purposes of simplicity and clarity. A more detailed schematic diagram of the driver circuit 10 may be found in FIG. 3.

The claimed level shifting circuit 10 can be integrated into a pHEMT MMIC C that will forward bias the gate 70 of the plurality of RF switching elements 68 and 70, generally (68a-68b and 70a-70b for example), when they are on, with the amount of forward bias being determined by another on MMIC Schottky diode gate in the driver circuit 10 to minimize forward current driven into the RF switch 12. The level shifting circuit 10 takes the negative CMOS levels (0 V/−5 V) normally applied by an external control ASIC that is introduced at port 58, and creates levels to bias an RP switch 68 or 70 into a lower loss state. This is done by forward biasing the pHEMT switch gates to the border of conduction, one diode drop forward biased according to the layout of FIG. 1. This improves the Ron-Coff ratio obtainable in a given process, and reduces switch insertion loss through the switch device S.

The switching circuit 12 may be powered by or caused to switch by the two supply voltages through lines or connections 60 and 62 normally available at a MMIC, with an on chip current limiting device and diode defining the upper voltage switch of the driver 10.

The four transistor switches or switching elements 68 or 70, generally (68a-68b and 70a-70b), of the SPDT switch segment 12 are biased at their gates to roughly +0.7 V or −3.3 V. All components shown are formed on the MMIC. The current sources of the switches 68 or 70, in order to minimize current, may be long channel (3μ/16μ) depletion mode pHEMTs 20 biased at IDSS (~100 μA) in processes that offer such long channel devices. In a pHemt process which does not offer low current long channel devices, the current source may still be implemented on chip by means of a resistor degenerated short channel FET, with the resistor causing it to run well below IDSS. The diodes are large area to keep the forward drop low and minimize the DC current flowing into the RF switches. Not shown are the usual several kOhm gate resistors and other associated electronic components that may be used in the RF switches to isolate the RF and DC circuits.

As is typical for transistor type devices, the present switching units include gate, drain and source electrodes or connections. Since the drain electrodes or connections 74 of switching components 68b and 70b are both connected to a ground 72, these components act as a shunt element in the present method of biasing the switching components 68 or 70.

In summary, a radio frequency semiconductor switching device S is formed on a monolithic microwave integrated circuit (MMIC) structure C and includes a switching circuit element 12 with at least four electronic semiconductor component switching units or transistors 68a-68b or 70a-70b with each switching unit 68 adapted for receiving a gate input signal at a gate electrode of the semiconductor switching units 68 or 70. A level shift circuit 10 generates a biasing voltage signal at an output source 60, 62. The level shift circuit output 60, 62 is electrically communicating with the gate electrodes of the switching units 68 or 70 for biasing the gate electrodes of the switching units 68 or 70. The level shift circuit 10 is responsive to an externally provided control signal 58. The semiconductor switching units 68 are formed into a grouping of at least a first and a second set 76 and 78, respectively, of interconnected semiconductor switching units with each set 76 and 78 of interconnected semiconductor switching units 68 or 70 having respective gate electrodes 73 or 75 of at least two of the interconnected switching units 68 or 70 in the set 76 or 78 of interconnected switching units being electrically connected with an output source 60 or 62 of the level shift circuit 10. Both the switching units 68 or 70 of the switching circuit elements 12 and the level shift circuit 10 are formed on the MMIC structure C.

As compared to a typical biasing method for a known semiconductor SPDT switch of applying zero volts for ON and a negative voltage for OFF, the present biasing method allows either for lower insertion loss, or use of smaller devices for lower capacitance and hence wider bandwidth. As compared with applying externally generated positive and negative voltages from a driver application-specific integrated circuit (ASIC), the present device S and method allows fewer interconnect (particularly if multiple SPDT switches were to be integrated together as is done in attenuators and phase shifters for transmit/receive (T/R) modules, not shown), and by using an on-chip diode of the driver circuit 10 that matches the RF switch gate diodes 68 to determine the positive voltage, the correct voltage amplitude is determined automatically.

The present invention is a circuit design technique that is applicable to all GaAs FET switches in process technologies where the FET gate is a diode (JFET, pHEMT, MESFET, for example). The RF switch devices 68 and 70, generally (68a-68b an 70a-70b), are electrically controlled switches of semiconductor devices, such as transistor-type electronic components.

Even though with zero volts on the gate, a pHEMT switch is ON. It is well known that the resistance of a pHEMT device decreases further as the gate source voltage is increased above zero volts. The voltage that can be applied is limited by the pHEMT devices Schottky Diode gate forward biasing. While it is possible to use dual supply voltages on an external control ASIC to take advantage of this effect, it is inconvenient to do so, and it is difficult to maximize the advantage of doing so by matching the positive swing to the pHEMT process diode drop since this changes with temperature.

Figure 5:
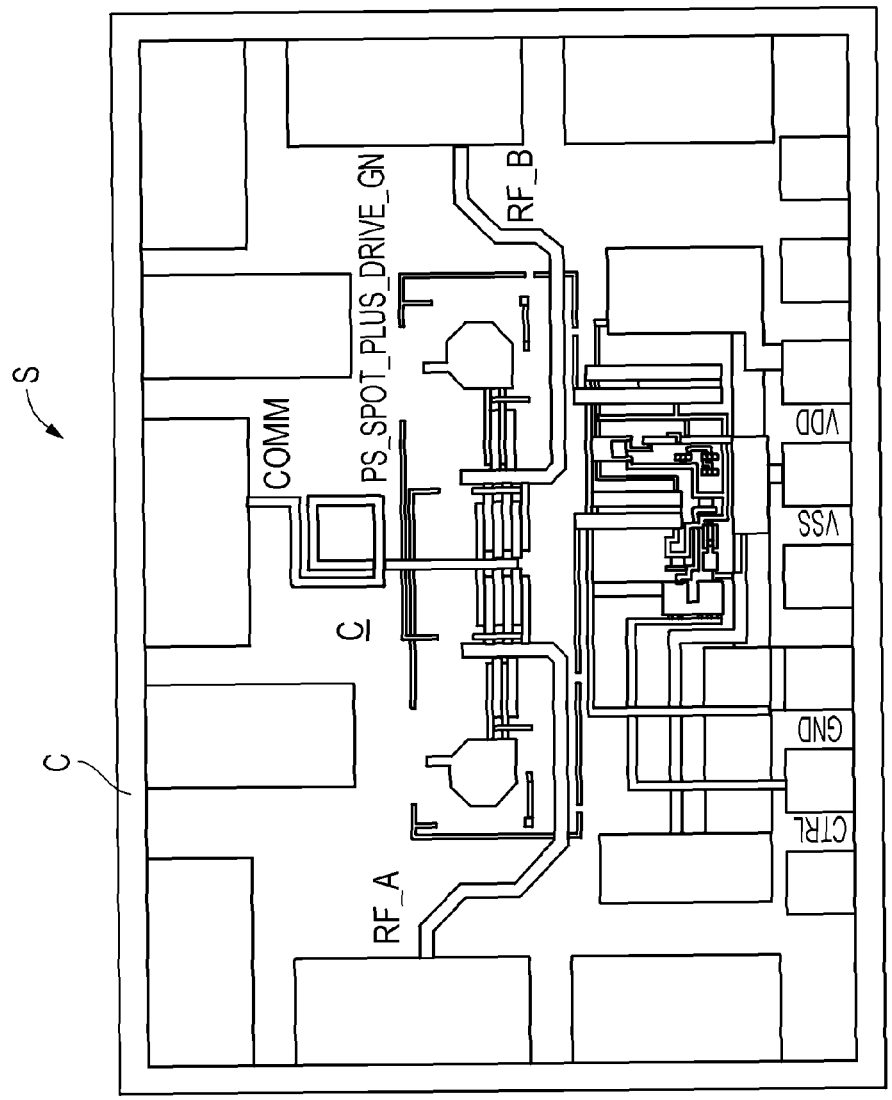
FIG. 5 is an exemplary layout diagram of a MMIC including SPDT switch and driver of the present invention.

FIG. 5 shows the MMIC layout included in a specific, exemplary mask set (labeled ng2185).

Figure 6:
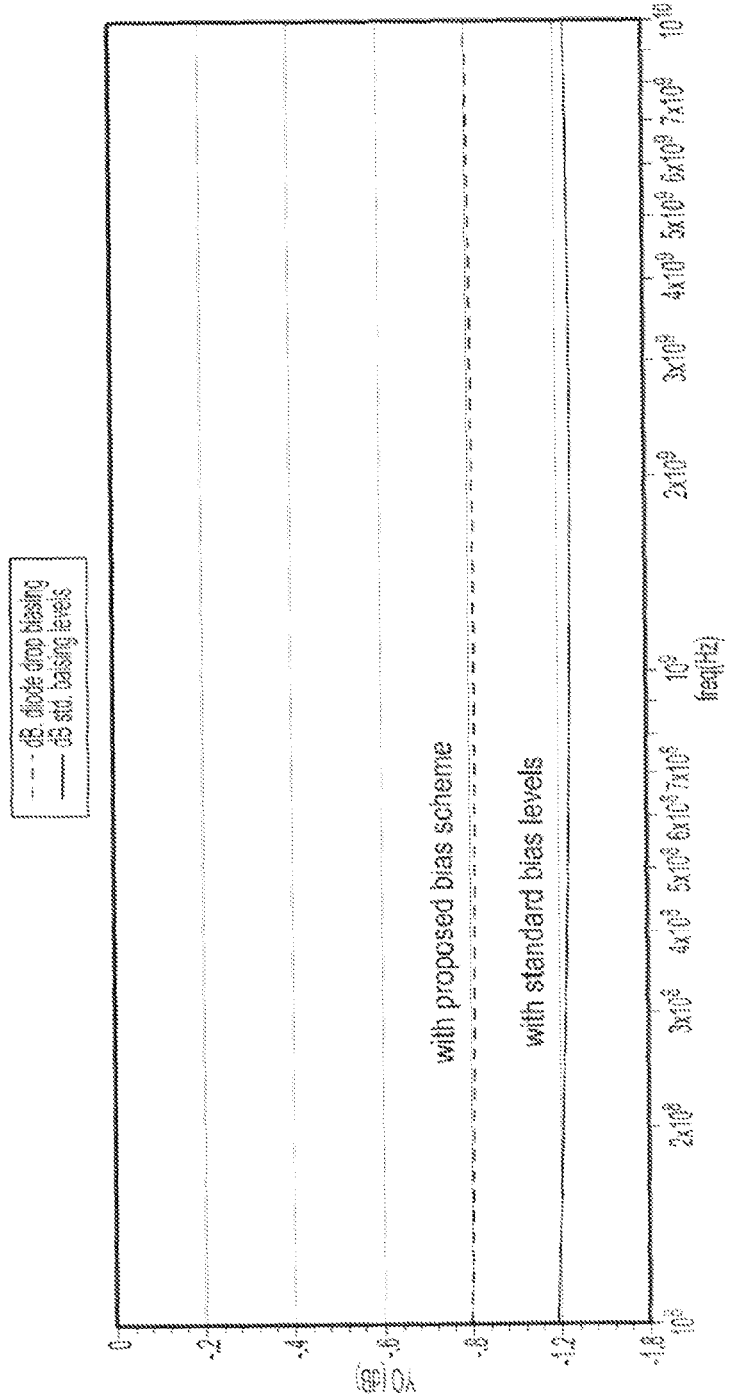
FIG. 6 is a graph depicting a simulation that demonstrates a 0.2 dB improvement in insertion loss resulting from the claimed biasing method.

FIG. 6 is a simulation of the insertion loss of a SPDT switch bias with either 0 V or one diode drop forward bias, showing an improvement in switch loss.

Multiple switching devices S of the present invention may be interconnected or ganged together to reduce line losses in situations where line loss is an important consideration. An example of a use for one or more of the present switching devices S is associated with electronically scanned or steerable antenna arrays used with modern radar systems for aircraft and the like.

The present invention has been implemented in a 0.25 μm pHEMT process, for example, using a combination of short and long channel devices, and included in a mask set.

The foregoing disclosure and description of the invention are illustrative and explanatory thereof, and various changes in the size, shape and materials, as well as in the details of the illustrated construction may be made without departing from the spirit of the invention.

The invention claimed is:

1. A radio frequency semiconductor switching device suitable for driving electronic circuits of the type including depletion mode MESFET, pHemt, or JFET elements formed on a monolithic microwave integrated circuit (MMIC) structure comprising:
   a switching circuit element including at least four electronic semiconductor component switching units with each switching unit adapted for receiving a gate input signal at a gate electrode of the semiconductor switching units;
   a level shift circuit generating a biasing voltage signal electrically communicating with the gate electrodes of the switching units for biasing the gate electrodes of the switching units where such bias voltage swings positive with respect to ground by an amount determined by an on MMIC diode to bias the switching units into a lower loss state; the level shift circuit being responsive to an externally provided control signal;
   the semiconductor switching units being formed into a grouping of at least a first and a second set of interconnected semiconductor switching units with each set of interconnected semiconductor switching units having respective gate electrodes of at least two of the interconnected switching units in the set of interconnected switching units being electrically connected with an output source of the level shift circuit; and,
   both the switching units and the level shift circuit being formed on the MMIC structure.

2. The invention of claim 1 wherein the level shift circuit further includes one or more on MMIC diodes for offsetting a source voltage of the control devices so they can fully switch OFF in response to an input control signal that swings between ground and a negative supply rail.

3. The invention of claim 1 wherein two of the semiconductor switching units form a shunt element for biasing the switching elements by providing a positive voltage to the gate when the respective switching unit is in an on state.

4. The invention of claim 1 wherein the switching units comprise pseudomorphic high electron mobility transistors (pHemt).

5. The invention of claim 1 wherein the switching units comprise a depletion mode, diode gate RF switching device of the type including pHemt, MESFET of SIT devices fabricated in materials of the type including GaAs, GaN, SiC or other comparable materials.

6. A method for switching an input signal at radio frequencies suitable for driving electronic circuits of the type including depletion mode MESFET, pHemt, or JFET elements on a monolithic microwave integrated circuit (MMIC) structure including the steps of:
   generating a biasing voltage signal at an output source of a level shift circuit and electrically communicating the voltage signal with gate electrodes of switching units for biasing the gate electrodes of the switching units where such bias voltage swings positive with respect to ground by an amount determined by an on MMIC diode to bias the switching units into a lower loss state; the level shift circuit being responsive to an externally provided control signal; the level shift circuit further includes one or more on MMIC diodes for offsetting a source voltage of the control devices so they can fully switch OFF in response to an input control signal that swings between ground and a negative supply rail; and,
   biasing with the biasing voltage signal at least four electronic semiconductor component switching units with each switching unit adapted for receiving a gate input signal at a gate electrode of the semiconductor switching units;
   whereby the semiconductor switching units are formed into a grouping of at least a first and a second set of interconnected semiconductor switching units with each set of interconnected semiconductor switching units having respective gate electrodes of at least two of the interconnected switching units in the set of interconnected switching units being electrically connected with an output source of the level shift circuit.

7. The method of claim 6 wherein both the switching units and the level shift circuit being formed on the MMIC structure.

8. The method of claim 6 wherein two of the semiconductor switching units form a shunt element for biasing the switching elements by providing a positive voltage to the gate when the respective switching unit is in an on state.

9. The method of claim 6 wherein the switching units comprise pseudomorphic high electron mobility transistors (pHemt).

* * * * *